(12) United States Patent
Tanaka et al.

(10) Patent No.: US 7,324,877 B2
(45) Date of Patent: Jan. 29, 2008

(54) TEMPERATURE CONTROL METHOD AND APPARATUS

(75) Inventors: Masahito Tanaka, Okayama (JP); Yosuke Iwai, Okayama (JP); Ikuo Nanno, Okayama (JP); Takaaki Yamada, Okayama (JP); Toshiro Miyachi, Yokohama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 11/245,727

(22) Filed: Oct. 6, 2005

(65) Prior Publication Data

US 2006/0161365 A1    Jul. 20, 2006

(30) Foreign Application Priority Data

Oct. 13, 2004    (JP)    .................... P2004-298803

(51) Int. Cl.
*G01K 15/00*    (2006.01)
(52) U.S. Cl. .................... 700/300; 700/299; 702/99; 702/130
(58) Field of Classification Search ................ 700/275, 700/276, 277, 278, 299, 300, 121; 219/494, 219/486; 702/99, 130
See application file for complete search history.

(56) References Cited

U.S. PATENT DOCUMENTS

| | | | |
|---|---|---|---|
| 4,688,180 A | | 8/1987 | Motomiya |
| 6,349,270 B1* | 2/2002 | Gurary et al. ................. 702/99 |
| 6,496,749 B1* | 12/2002 | Yamaguchi et al. ......... 700/121 |
| 6,803,548 B2* | 10/2004 | Wang et al. ................. 219/494 |
| 6,810,298 B2* | 10/2004 | Emoto ......................... 700/121 |
| 2002/0055080 A1 | 5/2002 | Kazuo |
| 2003/0121905 A1* | 7/2003 | Nanno et al. ............... 219/486 |

FOREIGN PATENT DOCUMENTS

EP    1291741    12/2003

OTHER PUBLICATIONS

EP Patent application No. 05021191.1-2206 Written Opinion dated Feb. 2, 2006.

* cited by examiner

*Primary Examiner*—Leo Picard
*Assistant Examiner*—Charles Kasenge
(74) *Attorney, Agent, or Firm*—Beyer Weaver LLP (57) ABSTRACT

In a method of controlling the temperature of a target object by measuring to obtain detected temperatures at a plurality of measurement positions and controlling a processing device such as a heater such that each detected temperature will match the corresponding one of target temperatures set for the processing device, a preliminary step is taken to determine the degrees of interference at the measurement positions by varying the target temperatures and the degrees of interference thus determined are used to correct the set target temperatures or the detected temperatures.

14 Claims, 4 Drawing Sheets

TEMPERATURE CONTROL METHOD AND APPARATUS

Priority is claimed on Japanese Patent Application 2004-298803 filed Oct. 13, 2004.

BACKGROUND OF THE INVENTION

This invention relates broadly to a method of controlling the physical condition of a target object of control such as its temperature and pressure, a temperature adjustor and a heat treatment apparatus using such a temperature adjustor. In particular, the invention relates to the technology of controlling the fluctuations in such a physical condition of a target object of a multi-input, multi-output interference system such as its temperature.

As disclosed in Japanese Patent Publication Tokkai 6-188462, for example, it has been known to use a temperature adjustor in the heat treatment of semiconductor wafers in the production process of semiconductor devices. When a semiconductor wafer is placed on a heat processing table to be heated in such a production process, a temperature adjustor is adapted to output signals based on temperatures detected by temperature sensors set for the heat processing table such that the temperature of the heat processing table will come to match a set temperature (target temperature) and the current to the heater for the heat processing table will be controlled through an electromagnetic switch or the like by these signals.

In such a heat treatment process for a semiconductor wafer, the temperature of the heat processing table must be controlled such that the semiconductor wafer can be subjected to a heat treatment uniformly at a desired temperature. For this purpose, a temperature control must be effected so as to correct the temperature difference between the semiconductor wafer and the heat processing table and the temperature fluctuations inside the wafer surface due to its positions.

For effecting such corrections, it is necessary to preliminarily carry out an adjustment work by using a test wafer having temperature sensors attached thereto, subjecting this test wafer to a heating process on the heat processing table, measuring the temperature distribution on the test wafer by this heating process and correcting the set temperature of the heat processing table or its detected (inputted) temperature inputted to the temperature adjustor such that the temperature of the test wafer will uniformly approach the desired temperature.

In the case of a multi-channel heat processing table having a plurality of temperature sensors and a plurality of heaters provided such that the currents to the heaters are individually controlled based on the temperatures outputted from these temperature sensors, the mutual interference among the channels makes it difficult to properly adjust the aforementioned set (or inputted) temperature. The operator's experience must be heavily depended upon and many trials and errors must be repeated.

SUMMARY OF THE INVENTION

It is therefore an object of this invention, in view of the problems of the prior art technology, to make it easier to adjust a target object to be controlled.

A control method according to this invention is for obtaining data (detected data) by detecting a physical condition of a processing means for processing a target object at a plurality of detection positions and controlling physical condition of this processing means such that each of these detected data matches corresponding one of a plurality of target data and may be characterized as comprising the steps of preliminarily determining degrees of interference of physical conditions at a plurality of measurement positions on this target object as the target data are varied and correcting at least the target data or the detected data based on the degrees of interference.

In the step of determining the degrees of interference, it is preferable to measure the physical condition of the target object at a plurality of measurement positions as the target conditions are varied such that the degree of interference at each of these positions can be obtained by a measurement but the relationship between the physical conditions of the target object and the processing means may be calculated from design data or by simulation in order to obtain the degrees of interference.

In the above, "physical condition" means conditions of any of physical quantities such as temperature, pressure, flow rate, speed or liquid level. "Detected data" are data on detected physical conditions such as detected temperatures, detected pressures and detected flow rates. "Target data" are data on control target values of a physical condition such as target temperatures, target pressures and target flow rates. "Degree of interference" means the degree to which the physical condition at each measurement point is affected by a control which is made such that target data are varied to make corresponding detected data come to match the target data, meaning the degree of interference by each channel.

The plurality of measurement positions are preferably those positions which are to be observed in order to achieve a desired physical condition. They may preferably be positions at which fluctuations of a physical condition such as temperature are desired to be suppressed. In the above, "fluctuations" may be those from an average physical condition detected at a plurality of detection positions or those from a physical condition detected at a reference position.

The correction to be effected in the "step for correcting" is preferably for correcting the difference between a physical condition of the processing means at the detection position and that of the target object at the detected position and/or for reducing the fluctuations of the physical condition at a plurality of measurement positions of the target object.

According to the method of this invention as described above, since such degrees of interference at many positions of the target object or the degrees of effects on a physical condition at each of many positions are preliminarily obtained as target data are varied, the work of adjustment for correcting the target data and detection data for processing the target object under desired physical conditions becomes much simpler.

A temperature control method is for obtaining detected temperatures by detecting temperature of a processing means for processing a target object at a plurality of detection positions and controlling temperature of this processing means such that each of these detected temperatures matches corresponding one of a plurality of target temperatures and may be characterized as comprising a first step of preliminarily measuring temperature of this target object at a plurality of measurement positions as the target temperatures are varied and determining degrees of interference at these measurement positions and a second step of obtaining correction values for correcting at least the target temperatures or the detected temperatures based on the determined degrees of interference.

In the first step of determining degrees of interference as described above, it is preferable to measure the temperature of the target object at a plurality of measurement positions as the target temperatures are varied such that the degree of interference at each of these positions can be obtained by a measurement but the relationship between the temperatures of the target object and the processing means may be calculated preliminarily from design data or by simulation in order to obtain the degrees of interference.

Similarly, many of the statements presented above regarding the control method according to this invention are also applicable to the temperature control method of this invention. For example, it is preferable that the correction values to be obtained be for reducing the fluctuations in temperature values at the plurality of measurement positions of the target object.

A temperature control method of this invention according to a preferred embodiment further comprises a third step of correcting at least either the target temperatures or the detected temperatures by using the obtained correction values. By such a method, the target object can be processed in a desired temperature condition.

It is also preferable that the first step include the step of obtaining a so-called interference matrix that relates changes in the target temperatures with changes in temperatures at the measurement positions of the target object and that the second step include the step of obtaining the correction values by using the inverse matrix of this interference matrix. By such a method, the user's experience or skill need not be depended on for the adjustment work.

The second step may include the step of obtaining the correction values such that fluctuations of temperatures at the measurement positions are reduced. If this is done, the target object can be processed in the condition of a uniform temperature.

The first step may include the step of determining the degree of interference as of the time when a specified time has elapsed since the target temperatures are varied. The specified time may be in the transient period during which the temperature of the target object is still continuing to change or the time taken to reach a steady state at which the temperature has stabilized. By thus specifying the time, correction can be effected such that the temperature of the target object either in the steady state condition or in the transient period will become equal to a desired temperature.

The aforementioned third step may include the step of correcting at least either the target temperatures or the detected temperatures over a period of time from when the processing means starts processing the target object until when the specified time has elapsed thereafter. By this embodiment, the temperature of a target object at a specified point in time can be controlled to be at a desired level by starting to correct at least either the target temperatures or the detected temperatures from the moment when the processing of the target object is started.

A temperature adjustor embodying this invention is adapted to detect temperatures of a processing means for processing a target object at a plurality of detection positions and to control the temperatures of the processing means such that each of the detected temperatures will match corresponding one of a plurality of target temperatures and may be characterized as comprising correcting means for correcting at least either the target temperatures or the detected temperatures based on the degree of interference at each of a plurality of measurement positions of the target object obtained by measuring temperatures at the plurality of measurement positions so as to reduce fluctuations of temperatures of the target object.

The correction effected by the correcting means is preferably for correcting the difference between the temperatures of the processing means at these detection positions and the temperatures of the target object at the measurement positions and/or for reducing the fluctuations of temperature at the plurality of measurement positions of the target object. The degree of interference at each measurement position may be preliminarily obtained by a host apparatus other than the temperature adjustor and stored in the temperature adjustor or may be obtained preliminarily by the temperature adjustor.

With such a temperature adjustor according to this invention, since the degree of interference at each measurement of the target object, or the degree of effects on the temperature at each measurement position, is preliminarily measured, the target temperatures and the detected temperatures can be corrected based on such measured degree of interference. Thus, the work of adjusting the target temperatures and detected temperatures becomes easier for carrying out the processing of the target object in a desired temperature condition.

According to an embodiment of the invention, the aforementioned correcting means includes a memory that stores correction values for correcting at least either the target temperatures or the detected temperatures. According to this embodiment, since the correction values stored by the memory can be used to correct the target temperatures or the detected temperatures, the adjustment work becomes easier.

According to a preferred embodiment of the invention, the correcting means includes both a memory that stores data indicating a relationship between changes in the target temperatures and changes in temperatures at the plurality of measurement positions of the target object and a calculating part that calculates correction values for correcting at least either the target temperatures or the detected temperatures by using the data stored in the memory. In the above, the data may include waveform data that show the relationship between the changes in the target temperatures and the changes in the temperatures at the plurality of measurement positions, as well as data on the interference matrix that shows the relationship between the changes in the target temperatures and the changes in the temperatures at the plurality of measurement positions.

According to this embodiment of the invention, since the calculating part calculates the correction values by using the data in the memory, the target temperatures and the detected temperatures are corrected by these calculated correction values and hence the user's experience or a method by trials and errors need no longer be depended upon.

The calculating part may be adapted to calculate the correction values by using the inverse matrix of an interference matrix that shows the relationship between changes in the target temperatures and changes in temperatures at the plurality of measurement positions of the target object. If the data stored in the memory are waveform data that show the relationship between the changes in the target temperatures and the changes in the temperatures at the plurality of measurement positions, it is preferable that the calculating part calculates the interference matrix from such waveform data.

The calculating part may be adapted to calculate the correction values so as to reduce fluctuations of temperatures of the plurality of measurement positions of the target object. The degree of interference may be taken as of when a specified length of time has elapsed since the processing means starts processing the target object. The correcting means may be adapted to correct at least either the target temperatures or the detected temperatures over the period from when the processing means starts processing the target object until the specified length of time has passed.

The invention relates also to a control system comprising processing means for processing a target object, heat-controlling means such as a heater or a cooler for heating or cooling this target object, detecting means for detecting temperature of the processing means and a temperature adjustor as described above.

DETAILED DESCRIPTION OF THE INVENTION

Figure 1:
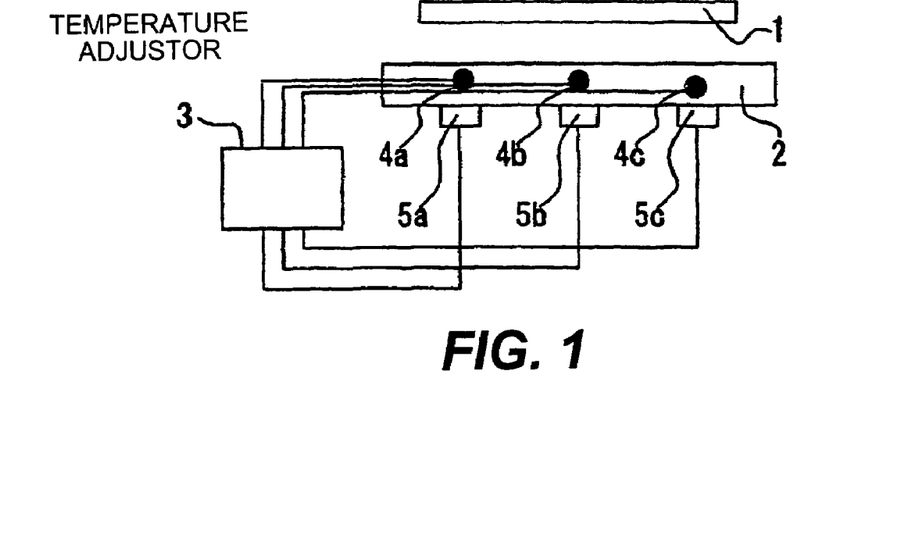
FIG. 1 is a schematic block diagram of a heat processing apparatus provided with a temperature adjustor embodying this invention.

The invention is described next with reference to the drawings. FIG. 1 schematically shows the structure of a heat processing apparatus provided with a temperature adjustor 3 embodying this invention, having a heat processing table 2 serving as a processing means for subjecting a semiconductor wafer 1 serving as a target object to a heating process. The temperature adjustor 3, in this example, is for serving to control the temperature of the heat processing table 2 by adjusting the currents to three heaters 5a, 5b and 5c provided to the heat processing table 2 based on deviations of the detected temperatures by three temperature sensors 4a, 4b and 4c provided to the heat processing table 2 from a set (target) temperature provided from a host apparatus or a setting means (not shown). In other words, this is an example with three channels of control and a temperature control is effected on each of these three channels.

The semiconductor wafer 1 to be subjected to a heating process by means of the heat processing table 2 is one of a plurality of similar semiconductor wafers that are each automatically transported by a conveyor (not shown) to be set on the heat processing table 2 so as to be sequentially subjected to a heating process.

Figure 2:
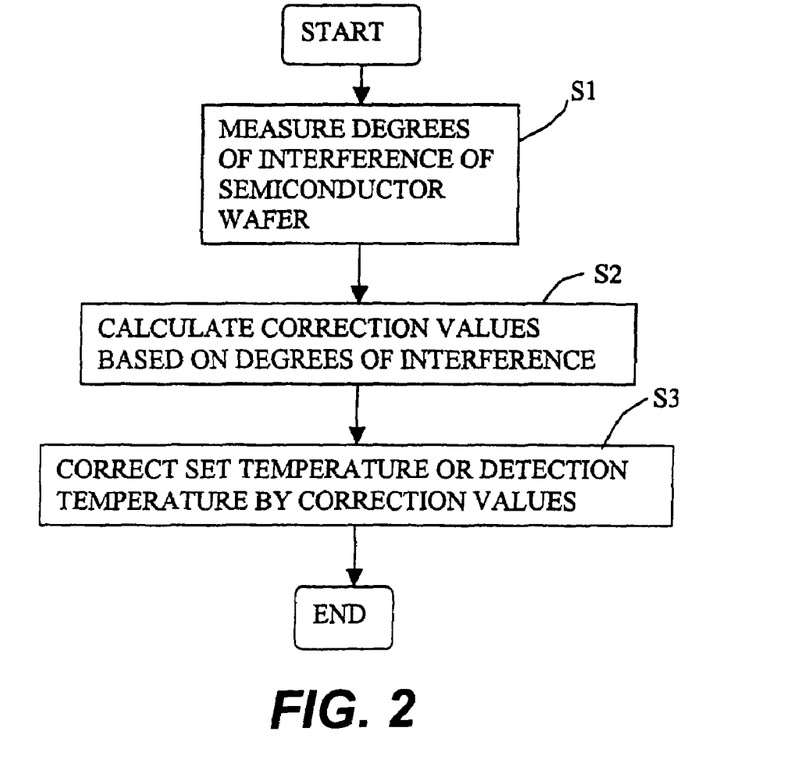
FIG. 2 is a flowchart of a temperature control method of this invention.

A temperature control method for this example comprises, as shown in FIG. 2, a first step (S1) of measuring the temperature of the semiconductor wafer 1 at a plurality of measurement positions as the set temperatures of the channels are sequentially varied and thereby preliminarily determining degrees of interference at each measurement position, a second step (S2) of calculating correction values for correcting at least either the set temperature or the detected temperature based on the measured degrees of interference, and a third step (S3) of correcting at least either the set temperature or the detected temperature by using the calculated correction values.

In the above, although the degrees of interference are obtained by measurement, they may be obtained by preliminarily obtaining the temperature propagation relationship from the heat processing table to the semiconductor wafer from the thermal design or a simulation calculation and obtaining the degree of interference from such propagation relationship. This method by omitting the measurement process has the advantage of significantly simplifying the whole process.

Figure 3:
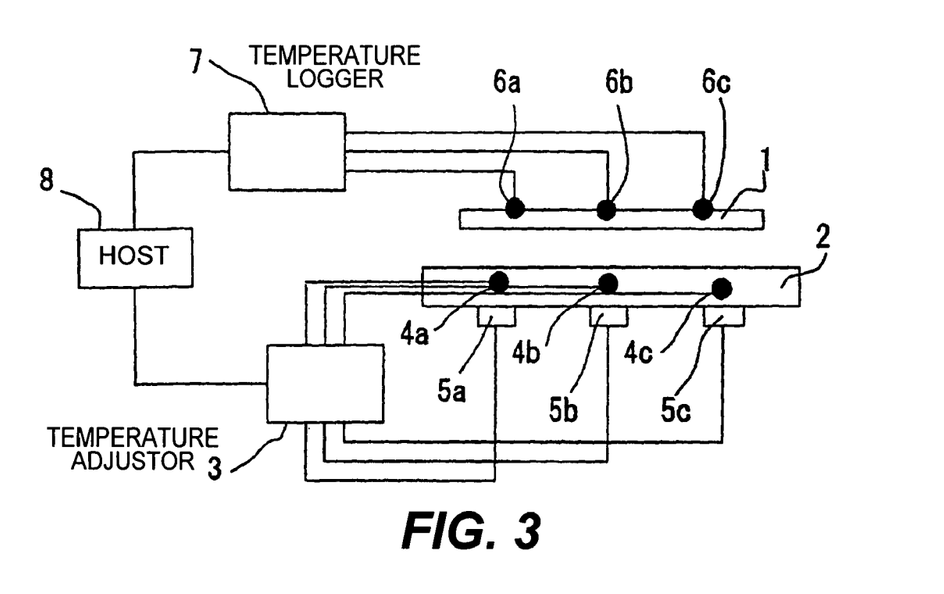
FIG. 3 is a drawing of a structure for measuring the degree of interference.

FIG. 3 shows an example of a structure for measuring the degree of interference for calculating the correction values. Like components shown in and explained above with reference to FIG. 1 are indicated by the same numerals. In FIG. 3, numeral 1 indicates a test wafer having temperature sensors 6a, 6b and 6c attached thereto, numeral 7 indicates a temperature logger for measuring the temperature of this test wafer 1 and numeral 8 indicates a host apparatus such as a programmable logic controller PLC or a personal computer connected to the temperature logger 7 and the temperature adjustor 3. This host apparatus 8 is adapted to change the set temperature of the temperature adjustor 3 through communication and to measure the set temperature and the temperatures of the measurement positions on the test wafer 1 in synchronism.

According to the illustrated embodiment of the invention, the host apparatus 8 is provided with a microcomputer. The degrees of aforementioned interference are calculated by carrying out a program stored in the ROM of this microcomputer and the correction values are calculated based on these degrees of interference. The calculated correction values are thereby set and stored in the temperature adjustor 3.

The measurement positions on the test wafer 1 are located so as to correspond to the heaters 5a, 5b and 5c of the individual channels of the heat processing table 2, as well as to the temperature sensors 4a, 4b and 4c.

Figures 4A, 4B:
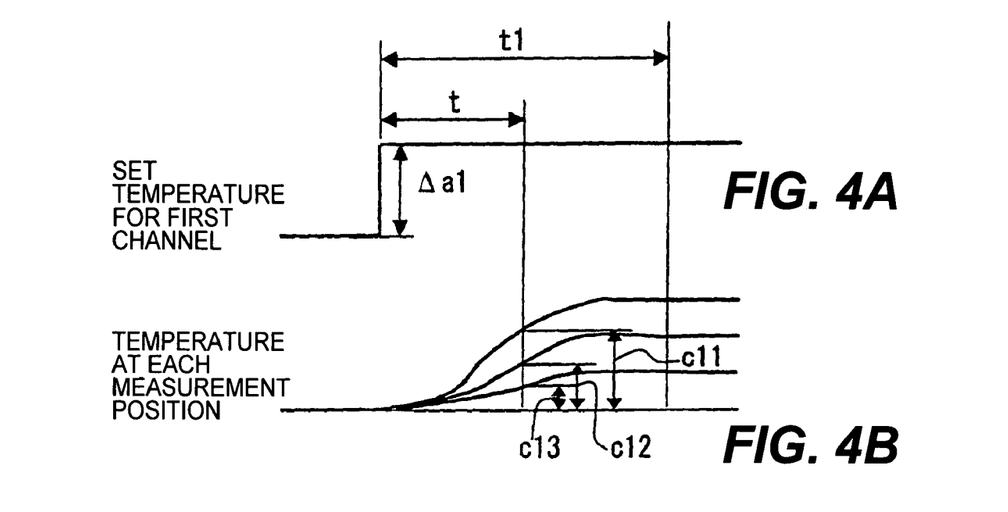
FIGS. 4A and 4B, together referred to as FIG. 4, show an example of temperature changes at measurement positions as a set temperature is changed in a stepwise manner.

To measure the thermal interference among the channels of the test wafer 1, or the effect on the temperature at each measurement position on the test wafer 1 when the set temperature is changed, the set temperature of the first of the three channels is changed in a stepwise manner as shown in FIG. 4A by $\Delta a1$ and the change in temperature at each of the measurement positions on the test wafer 1 is measured by using the temperature sensors 6a-6c as shown in FIG. 4B. Similarly, the set temperature of the second channel is change in a stepwise manner by $\Delta a2$ to measure the change in temperature at each of the measurement positions and the set temperature of the third channel is change in a stepwise manner by $\Delta a3$ to measure the change in temperature at each of the measurement positions. From the measured data thus obtained, the degree of interference at any point in time after the change of set temperature can be obtained in the form of a so-called interference matrix.

Let c11, c12 and c13 respectively be the changes in temperature at the three measurement positions at specified time t after the set temperature of the first channel is changed stepwise by $\Delta a1$. Similarly, let c21, c22 and c23 respectively be the changes in temperature at the three measurement positions at specified time t after the set temperature of the second channel is changed stepwise by $\Delta a2$, and let c31, c32 and c33 respectively be the changes in temperature at the three measurement positions at specified time t after the set temperature of the third channel is changed stepwise by $\Delta a3$. The interference matrix corresponding to the specified time t is expressed as follows:

$$\begin{bmatrix} c_{11} & c_{21} & c_{31} \\ c_{12} & c_{22} & c_{32} \\ c_{13} & c_{23} & c_{33} \end{bmatrix} \quad (1)$$

And if the temperature changes at the three measurement positions on the test wafer 1 are $\Delta b1$, $\Delta b2$ and $\Delta b3$ at the specified time t after the set temperatures of the three channels are changed by $\Delta a1$, $\Delta a2$ and $\Delta a3$, the relationship between them can be expressed as follows:

$$\begin{bmatrix} \Delta b_1 \\ \Delta b_2 \\ \Delta b_3 \end{bmatrix} = \begin{bmatrix} c_{11} & c_{21} & c_{31} \\ c_{12} & c_{22} & c_{32} \\ c_{13} & c_{23} & c_{33} \end{bmatrix} \begin{bmatrix} \Delta a_1 \\ \Delta a_2 \\ \Delta a_3 \end{bmatrix} \quad (2)$$

By variously selecting the specified value of t, it is possible to obtain a relationship in a steady state when the temperature of the test wafer 1 has been stabilized after the set temperatures are changed and also another relationship during the transient period while the temperature of the test wafer 1 is still changing.

In the above, it was described that each set temperature is sequentially changed in a stepwise manner, but this is not intended to limit to scope of the invention. As another embodiment of the invention, each set temperature may be changed at random like maximal-length sequence signals and the temperature change of the test wafer may be expressed in an ARX model by using the method of least squares.

It is also to be noted that although the number of measurement positions on the test wafer 1 was made equal to the number of control channels of the temperature adjustor 3 in the above example, they are not required to be equal. If the number (=m) of measurement positions is larger than the number (=n) of control channel points, n-number of the measurement positions that are the most strongly related to the control channel number may be selected to carry out the procedure described above. Alternatively, an optimization search algorithm such as genetic algorithm or hill-climbing algorithm or a matrix calculation method may be employed such that the total of the differences between the m-number of output values against n-number of input values from the desired temperature will be minimized.

As explained above, an interference characteristic can be obtained either for a steady state condition or for a transient condition by selecting the specified value of t. In what follows, methods of calculating correction values for reducing the temperature fluctuations of a semiconductor wafer and making its surface temperature uniform will be described under both of these conditions.

(1) Method of Making Surface Temperature Uniform in the Steady State Condition

This is for correcting the set temperature of the heat processing table 2 or the detected temperature of the heat processing table 2 inputted to the temperature adjustor 3 for controlling the temperature fluctuation of the semiconductor wafer 1 in a steady state condition (where the wafer 1 has been placed on the heat processing table 2 and its temperature has been raised to a specified condition) and making its surface temperature uniform. By this example, correction values for the purpose of making this correction are calculated as follows.

The test wafer 1 is processed by the heat processing table 2 under a regulated condition and as the temperature of the test wafer becomes regulated, the temperature of each measurement position is measured and its difference from a desired (target) temperature is calculated. Let $\Delta b1$, $\Delta b2$ and $\Delta b3$ denote these calculated values. If it is desired to heat a semiconductor wafer uniformly to 100° C. (=the target temperature) and if a test wafer is placed on the heat processing table 2 regulated to the set temperature of 100° C. and the temperatures of its measurement positions when it is in a regulated condition are 97° C., 98° C. and 99° C., for example, the calculated values become $\Delta b1=3$, $\Delta b2=2$ and $\Delta b3=1$.

The surface temperature can be made uniform by obtaining correction values $\Delta a1$, $\Delta a2$ and $\Delta a3$ for the set temperature values of the heat processing table 2 corresponding to the three channels or the detected (input) temperatures of the heat processing table 2 to be inputted to the temperature adjustor 3 so as to reduce the calculated values $\Delta b1$, $\Delta b2$ and $\Delta b3$ which represent the differences from the desired target temperature. The values of $\Delta a1$, a2 and $\Delta a3$ can be calculated as shown below by using the inverse matrix of the aforementioned interference matrix:

$$\begin{bmatrix} \Delta a_1 \\ \Delta a_2 \\ \Delta a_3 \end{bmatrix} = \begin{bmatrix} c_{11} & c_{21} & c_{31} \\ c_{12} & c_{22} & c_{32} \\ c_{13} & c_{23} & c_{33} \end{bmatrix}^{-1} \begin{bmatrix} \Delta b_1 \\ \Delta b_2 \\ \Delta b_3 \end{bmatrix} \quad (3)$$

The interference matrix used in the above equation (3) is one corresponding to a steady state condition, say, obtained at time t1 shown in FIG. 4A, that is, after the set temperature is changed and the temperature of each measurement position has stabilized.

Correction values can be obtained simply by solving this equation (3), not by trials and errors according to prior art methods of obtaining correction values.

It is also possible to use the interference matrix for predicting the temperature fluctuations in a semiconductor wafer after the correction values thus calculated are added to the set temperature of the heat processing table 2 or the detected temperatures of the heat processing table 2 inputted to the heat adjustor 3 to make a correction.

(2) Method of Making Surface Temperature Uniform in the Transient Condition

This is a situation where the surface temperature is made uniform by reducing the temperature fluctuations of a semiconductor wafer in a transient condition during the period after the wafer is placed on the heat processing table 2 until its temperature stabilizes.

Although a correction process is carried out sufficiently to make the surface temperature uniform in a stead state condition, the temperature difference is large on the wafer when it is in a transient condition.

Figure 5A:
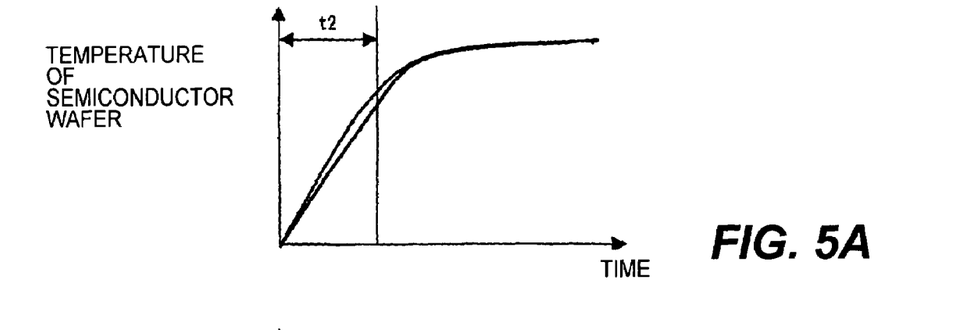
FIGS. 5A and 5B, together referred to as FIG. 5, show an example of temperature change and change in temperature difference on a semiconductor wafer.
Figure 5B:
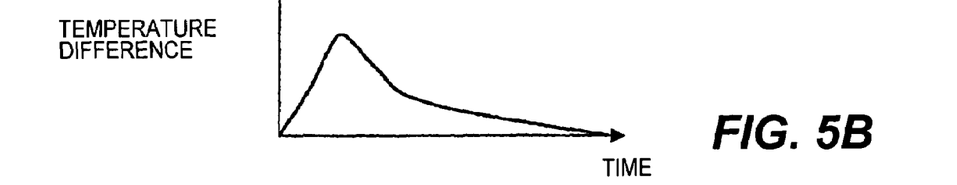

FIG. 5A shows an example of changes in temperature at two of the measurement positions of a semiconductor wafer 1 placed on the heat processing table 2 between which the temperature difference is the largest and FIG. 5B shows the change in this temperature difference in an exaggerated manner. As shown in FIG. 5A, the temperature of the wafer 1 starts increasing as soon as it is placed on the heat processing table 2 and a fluctuation occurs during the transient period until a steady state is reached.

In order to control such a fluctuation and to thereby make the surface temperature uniform, a point in time at which it is desired to control the temperature fluctuation is determined, and the length of time from when the wafer is placed on the heat processing table 2 until this point in time is referred to as the aforementioned specified time.

FIG. 5A shows an example wherein a chemical reaction progresses suddenly at time t2 as the wafer is heated. Let us assume that this time t2 is to be used as the aforementioned specified time at which the temperature fluctuation is to be controlled. Then, a test wafer is placed on the heat processing table 2 and temperatures at the measurement positions are measured at time t2. Let $\Delta b1$, $\Delta b2$ and $\Delta b3$ again denote the differences between the measured temperatures and a desired target temperature. The desired target temperature for this purpose may be set equal to the average of the measured temperatures at the three measurement positions.

In order to make the surface temperature of the test wafer uniform during the transient period, correction values $\Delta a1$, $\Delta a2$ and $\Delta a3$ for detected temperatures of the heat processing table 2 are obtained so as to reduce the calculated values of $\Delta b1$, $\Delta b2$ and $\Delta b3$. This can be done, as explained above, by using Equation (3) except that the interference matrix is selected for time t2, that is, the interference corresponding to this transient period is used.

The calculation for the correction values $\Delta a1$, $\Delta a2$ and $\Delta a3$ is carried out by a host apparatus 8 as the user inputs the specified time t and the temperature differences $\Delta b1$, $\Delta b2$ and $\Delta b3$ from the desired target temperature. Thus, the user's experience need not be depended upon and repeated trials and errors can be obviated by this automated method. The corrected values obtained by the host apparatus 8 may be transmitted to the temperature adjustor 3 to be stored in its memory part.

Figure 6A:
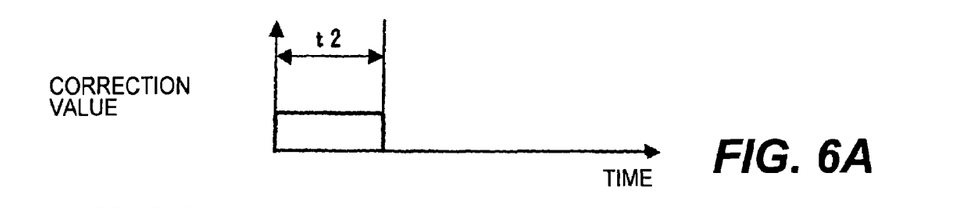
FIGS. 6A, 6B and 6C, together referred to as FIG. 6, show an example of correction value, change in the temperature of a semiconductor wafer and change in temperature difference.
Figure 6B:
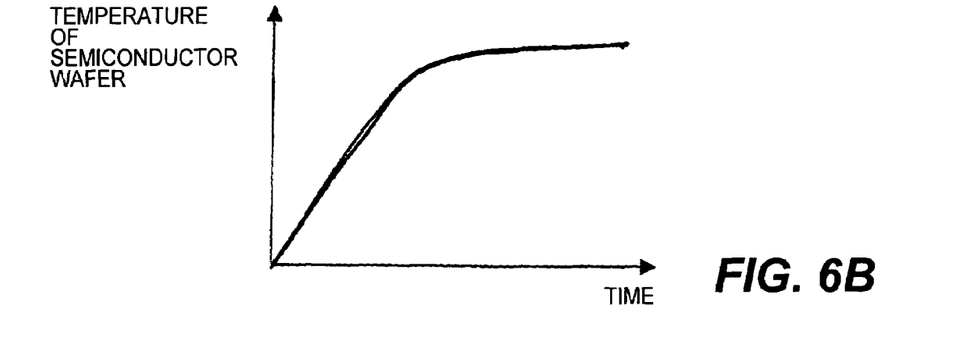
Figure 6C:
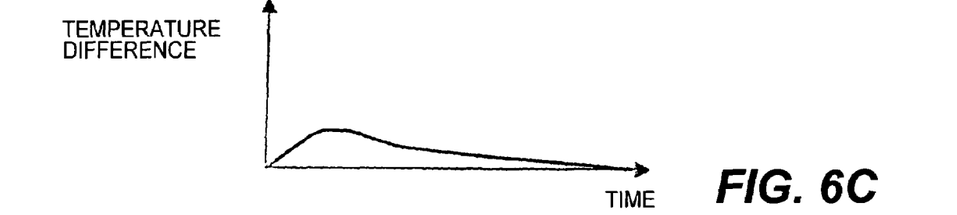

FIG. 6 (comprising FIGS. 6A, 6B and 6C) shows the results of correction thus effected to the set temperature of the heat processing table 2 or its detected temperatures inputted to the temperature adjustor 3, FIG. 6A showing the correction value and FIGS. 6B and 6C respectively corresponding to FIGS. 5A and 5B. For convenience, FIG. 6A shows the correction value of only one of the channels.

By this example, correction is effected from when the semiconductor wafer 1 is placed on the heat processing table 2 until the specified length of time t2 has elapsed by adding the correction values to the set temperature of the heat processing table 2 or the detected temperature of the heat processing table 2 inputted to the temperature adjustor 3. By this correction, the temperature fluctuations when the specified length of time t2 has passed are reduced and the surface temperature of the semiconductor wafer 1 can be made more uniform.

Figure 7:
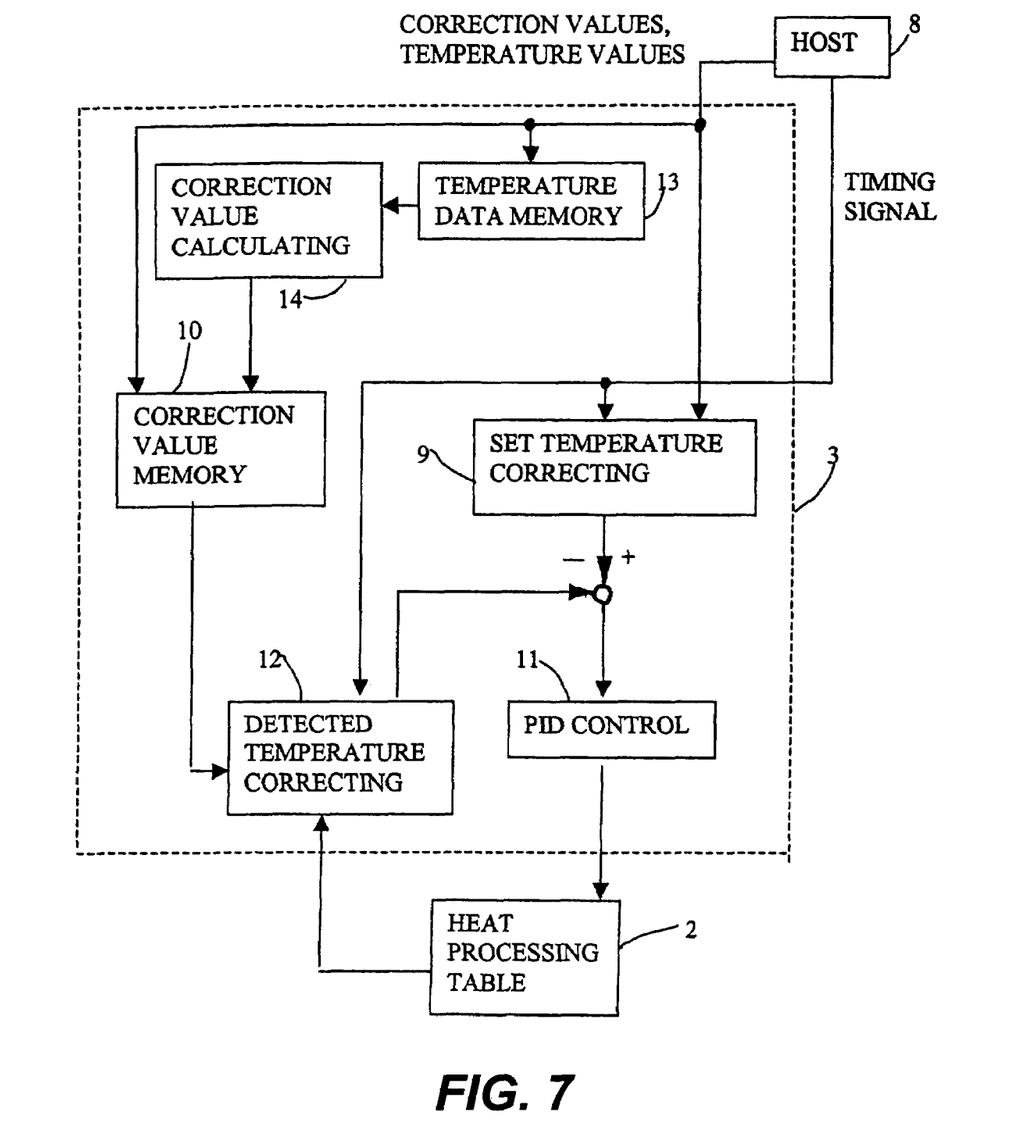
FIG. 7 is a block diagram of a temperature adjustor.

FIG. 7 is a block diagram of the temperature adjustor 3 embodying this invention. As shown, the temperature adjustor 3 is provided with a correction part 9 and a correction value memory 10 for storing the correction values calculated as explained above. A timing signal which indicates that a semiconductor wafer 1 has been placed on the heat processing table 2 is communicated from the host apparatus 8 to the correction part 9. Over a specified time period of t2 after the timing signal is received, it serves to add the correction value to the set temperature and to output the result.

A PID control unit 11 serves to carry out a PID calculation based on the deviation between the detected temperature and the set temperature with the correction value added over the specified period of t2 from when the semiconductor wafer 1 is placed on the heat processing table 2 and the heat processing is started as shown in FIG. 6A. A signal MV is outputted to control the currents that pass to the heaters 5a, 5b and 5c provided to the heat processing table 2 so as to control the temperature fluctuations on the semiconductor wafer 1 and to make its surface temperature uniform. The set temperature need not be corrected by this calculated correction value. A corrected temperature correction part 12 may be employed to add a correction value to the detected temperature of the heat processing table 2 to correct the detected temperatures.

In the above, the correction part 9, the correction value memory 10 and the PID control unit 11 may each be realized by a microcomputer.

The invention has been described above by way of only one example but this example is not intended to limit the scope of the invention. Many modifications and variations are possible within the scope of this invention. Although it was described above that correction is made only once over a specified period of time, a plurality of corrections may be effected, for example, by carrying out a first correction by using a corresponding correction value until a first specified period of time has passed and using another corresponding correction value until a second specified time t2.

Although it was stated above that it is the host apparatus 8 that measures the degree of interference and calculates correction values, the temperature adjustor may be adapted to measure the temperature of the test wafer and to calculate correction values. Similarly, although an example was shown above whereby correction values are stored in the temperature adjustor and a set temperature is corrected based on the stored correction values, the temperature adjustor may be provided with a temperature data memory 13 and a correction value calculating part 14, as shown in FIG. 7 such that data obtained by measuring the temperature of the test wafer are received from the host apparatus 8 and stored in the temperature data memory 13, the correction value calculating part 14 calculates the interference matrix and the correction values based on these data and the calculated correction values are stored in the correction value memory 10.

A table of correction values corresponding to the temperature differences $\Delta b1$, $\Delta b2$ and $\Delta b3$ from the aforementioned specified time and the desired temperature may be stored in the temperature adjustor such that correction of the set temperature or the detected temperature may be carried out by using the correction values of such a table or correction values corrected by using such correction values.

Although correction was described above such that the temperature of a semiconductor wafer will come to be in a desired temperature condition, measurement positions may be selected where the temperature sensors 4a, 4b and 4c of the heat processing table 2 are not provided and the correction may be effected such that the temperatures at these measurement positions will come to be of a desired temperature value.

Although the invention was described above for a case with three channels, it goes without saying that the number of channels is not intended to limit the scope of the invention. Although the invention was described above as applied to the control of temperature of a heat processing table, it can be applied to temperature control apparatus of other kinds such as diffusion furnaces, CVD apparatus, packaging machines and cylinder portions of a molding apparatus. Although the invention was explained above as applied to a heating process using a heater, the invention is also applicable to a cooling process using a Pertier element or a cooler of a different kind. It is also applicable to a temperature control combining both heating and cooling.

It is further to be noted that the present invention is not limited to a temperature control but may be applicable to control of other physical quantities such as pressure, flow rate or speed or liquid level.

What is claimed is:

1. A temperature control method for obtaining detected temperatures; said temperature control method comprising:
    detecting temperature of a processing means for processing a target object at a plurality of detection positions;
    controlling temperature of said processing means such that each of said detected temperatures matches corresponding one of a plurality of target temperatures;
    a first step of preliminarily measuring temperature of said target object at a plurality of measurement positions as said target temperatures are varied and determining degrees of interference at said measurement positions; and
    a second step of obtaining correction values for correcting at least either of said target temperatures and said detected temperatures of said processing means based on said determined degrees of interference;
    wherein said first step includes the step of obtaining an interference matrix that relates changes in said target temperatures with changes in temperatures at said measurement positions of said target object and wherein said second step includes the step of obtaining said correction values by using the inverse matrix of said interference matrix.

2. The temperature control method of claim 1 wherein said second step includes the step of obtaining said correction values such that fluctuations of temperatures at said measurement positions are reduced.

3. A temperature control method for obtaining detected temperatures; said temperature control method comprising:
    detecting temperature of a processing means for processing a target object at a plurality of detection positions;
    controlling temperature of said processing means such that each of said detected temperatures matches corresponding one of a plurality of target temperatures;
    a first step of preliminarily measuring temperature of said target object at a plurality of measurement positions as said target temperatures are varied and determining degrees of interference at said measurement positions;
    a second step of obtaining correction values for correcting at least either of said target temperatures and said detected temperatures of said processing means based on said determined degrees of interference; and
    a third step of correcting at least either of said target temperatures and said detected temperatures by using said obtained correction values;
    wherein said first step includes the step of determining said degree of interference as of when a specified time has elapsed since said target temperatures are varied.

4. The temperature control method of claim 3 wherein said third step includes the step of correcting at least either of said target temperatures and said detected temperatures over a period from when said processing means starts processing said target object until when said specified time has elapsed thereafter.

5. In a temperature adjustor adapted to detect temperatures of a processing means for processing a target object at a plurality of detection positions and to control said temperatures of said processing means such that each of said detected temperatures will match corresponding one of a plurality of target temperatures, the improvement wherein said temperature adjustor comprises correcting means for correcting at least either of said target temperatures and said detected temperatures of said processing means based on degree of interference at each of a plurality of measurement positions of said target object obtained by measuring temperatures of said target object at the plurality of measurement positions so as to reduce fluctuations of temperatures of said target object,
    wherein said correcting means includes:
    a memory storing data that indicate a relationship between changes in said target temperatures and changes in temperatures at the plurality of measurement positions of said target object; and
    a calculating part that calculates a correction value for correcting at least either of said target temperatures and said detected temperatures by using said data stored in said memory,
    wherein said calculating part calculates said correction value by using the inverse matrix of interference matrix that shows the relationship between changes in said target temperatures and changes in temperatures at the plurality of measurement positions of said target object.

6. The temperature adjustor of claim 5 wherein said correcting means includes a memory that stores a correction value for correcting at least either of said target temperatures and said detected temperatures.

7. The temperature adjustor of claim 5 wherein said calculating part calculates said correction value so as to reduce fluctuations of temperatures of the plurality of measurement positions of said target object.

8. In a temperature adjustor adapted to detect temperatures of a processing means for processing a target object at a plurality of detection positions and to control said temperatures of said processing means such that each of said detected temperatures will match corresponding one of a plurality of target temperatures, the improvement wherein said temperature adjustor comprises correcting means for correcting at least either of said target temperatures and said detected temperatures of said processing means based on degree of interference at each of a plurality of measurement positions of said target object obtained by measuring temperatures of said target object at the plurality of measurement positions so as to reduce fluctuations of temperatures of said target object, and wherein said degree of interference is as of when a specified length of time has elapsed since said processing means starts processing said target object.

9. The temperature adjustor of claim 8 wherein said correcting means corrects at least either of said target temperatures and said detected temperatures over the period from when said processing means starts processing said target object until said specified length of time has passed.

10. A control system comprising:
    processing means for processing a target object;
    heat-controlling means for heating or cooling said target object;
    detecting means for detecting temperature of said processing means; and
    a temperature adjustor adapted to detect temperatures of said processing means at a plurality of detection positions and to control said temperatures of said processing means such that each of said detected temperatures will match corresponding one of a plurality of target temperatures, said temperature adjustor comprising correcting means for correcting at least either of said target temperatures and said detected temperatures based on degree of interference at each of a plurality of measurement positions of said target object obtained by measuring temperatures at the plurality of measurement positions so as to reduce fluctuations of temperatures of said target object;

wherein said correcting means includes:

a memory storing data that indicate a relationship between changes in said target temperatures and changes in temperatures at the plurality of measurement positions of said target object; and a calculating part that calculates a correction value for correcting at least either of said target temperatures and said detected temperatures by using said data stored in said memory, and wherein said calculating part calculates said correction value by using the inverse matrix of interference matrix that shows the relationship between changes in said target temperatures and changes in temperatures at the plurality of measurement positions of said target object.

11. The control system of claim 10 wherein said correcting means includes a memory that stores a correction value for correcting at least either of said target temperatures and said detected temperatures.

12. The control system of claim 10 wherein said calculating part calculates said correction value so as to reduce fluctuations of temperatures of the plurality of measurement positions of said target object.

13. A control system comprising:

processing means for processing a target object;

heat-controlling means for heating or cooling said target object;

detecting means for detecting temperature of said processing means; and a temperature adjustor adapted to detect temperatures of said processing means at a plurality of detection positions and to control said temperatures of said processing means such that each of said detected temperatures will match corresponding one of a plurality of target temperatures, said temperature adjustor comprising correcting means for correcting at least either of said target temperatures and said detected temperatures based on degree of interference at each of a plurality of measurement positions of said target object obtained by measuring temperatures at the plurality of measurement positions so as to reduce fluctuations of temperatures of said target object, wherein said degree of interference is as of when a specified length of time has elapsed since said processing means starts processing said target object.

14. The control system of claim 13 wherein said correcting means corrects at least either of said target temperatures and said detected temperatures over the period from when said processing means starts processing said target object until said specified length of time has passed.

* * * * *